United States Patent [19]
Nakajima et al.

[11] Patent Number: 5,780,942
[45] Date of Patent: Jul. 14, 1998

[54] INPUT CIRCUIT AND SEMICONDUCTOR INTEGRATED CIRCUIT DEVICE INCLUDING SAME

[75] Inventors: Takao Nakajima, Ebina; Kenichi Nakamura, Sumida-Ku, both of Japan

[73] Assignee: Kabushiki Kaisha Toshiba, Tokyo, Japan

[21] Appl. No.: 638,928

[22] Filed: Apr. 25, 1996

[30] Foreign Application Priority Data

Apr. 28, 1995 [JP] Japan ................................. 7-105939

[51] Int. Cl.$^6$ ................................................ H01H 7/00
[52] U.S. Cl. ........................ 307/141; 307/139; 327/198; 327/317; 327/318
[58] Field of Search ........................ 307/141, 139; 365/189.09; 364/273, 273.1, 273.2, 273.3, 277.4, 273.5, 492; 327/143, 318, 317, 198

[56] References Cited

U.S. PATENT DOCUMENTS

| | | | |
|---|---|---|---|
| 4,849,657 | 7/1989 | Boisvert | 307/41 |
| 5,345,422 | 9/1994 | Redwine | 365/189.09 |
| 5,369,310 | 11/1994 | Baydal et al. | 327/143 |

*Primary Examiner*—William M. Shoop, Jr.
*Assistant Examiner*—Albert W. Paladini
*Attorney, Agent, or Firm*—Loeb & Loeb LLP

[57] ABSTRACT

The disclosed input circuit incorporated in semiconductor integrated circuit device will not be operated erroneously due to fluctuations of a supply (or reference) potential caused by noise, for instance. The input circuit includes a signal input terminal for applying an external input signal; a first input potential detecting circuit for comparing a potential of the input signal with a predetermined supply (or reference) potential to detect a potential difference between the two; a second input potential detecting circuit activated in response to a control signal, for comparing the potential of the input signal with the predetermined supply (or reference) potential to detect the potential difference between the two; a delay circuit for delaying an output of the first input potential detecting circuit by a predetermined delay time; a latch circuit for inputting an output signal of the delay circuit as data and an output signal of the second input potential detecting circuit as a clock, to generate an output signal according to potentials of these two inputted signals; and a signal output terminal for outputting the output signal of the latch circuit.

16 Claims, 5 Drawing Sheets

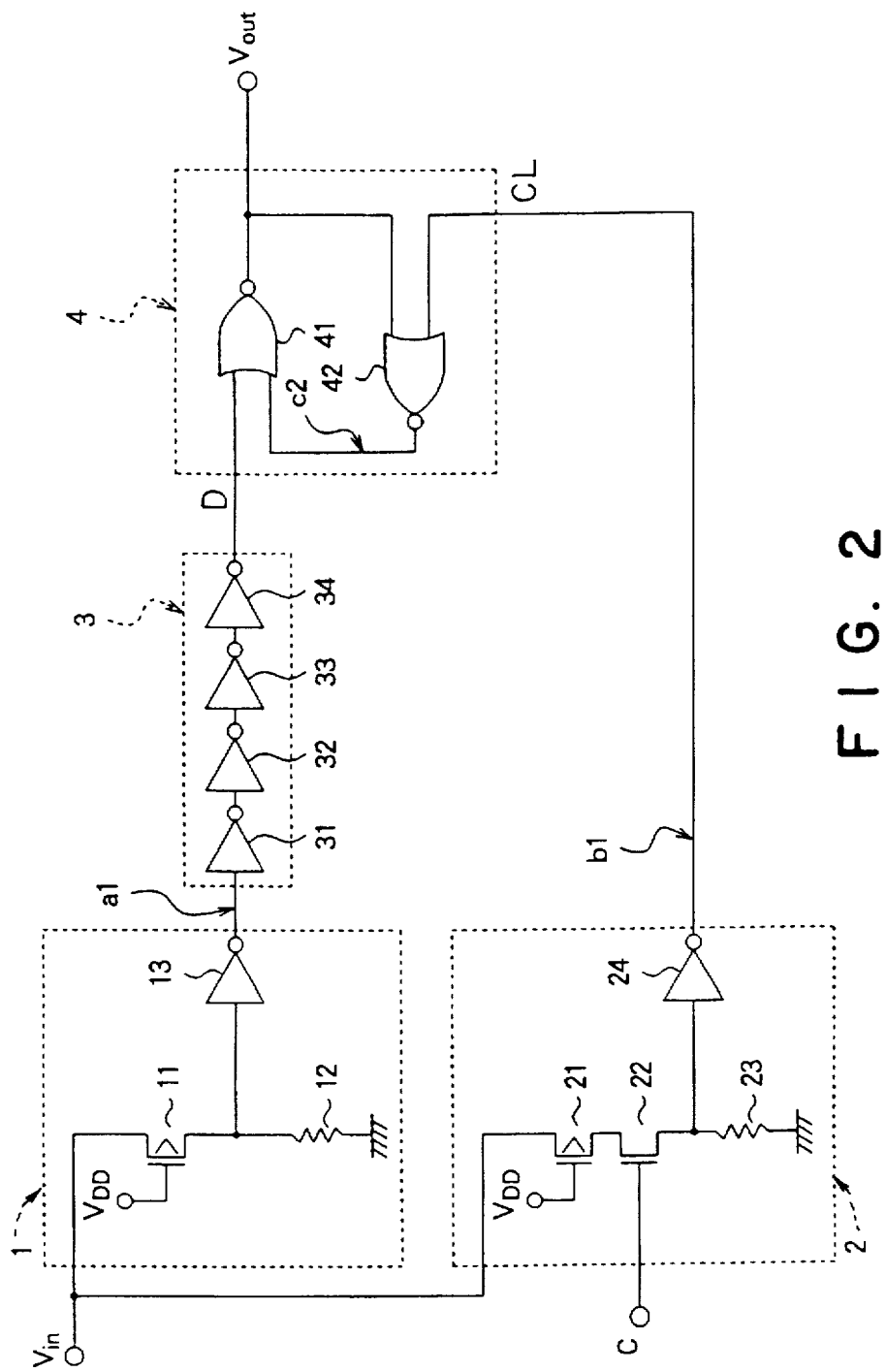
F I G. 2

INPUT CIRCUIT AND SEMICONDUCTOR INTEGRATED CIRCUIT DEVICE INCLUDING SAME

BACKGROUND OF THE INVENTION

The present invention relates to an input circuit and a semiconductor integrated circuit device including the input circuit, and more specifically to an input circuit including circuits for detecting the potential of an input signal in order to prevent the input circuit from being operated erroneously due to fluctuations of a supply voltage from which a reference voltage is generated.

In the semiconductor integrated circuit device, the operating characteristics thereof are subjected to the influence of fluctuations of the supply or reference voltage and temperature to some extent, with the result that there are cases where the integrated circuit device may be operated erroneously. On the other hand, the importance of the precision and stability of the supply or reference voltage has increased more and more with the advance of complicated and high speed operation of the integrated circuit device.

FIG. 1 is a block diagram showing a prior art input potential detecting circuit incorporated in a semiconductor integrated circuit device. The circuit construction and operation of this input potential detecting circuit shown in FIG. 1 will be described hereinbelow with reference to FIGS. 4A, 4C and 4D.

In FIG. 1, a supply voltage $V_{DD}$ is applied to the gate of a P-channel MOS transistor 101 as a reference potential. Further, an input signal $V_{in}$ (where $|V_{in}|$ also expresses the potential value thereof) is applied to any one of the source and drain of the same P-channel MOS transistor 101, and a signal is outputted from the other of the two thereof. Further, and one of the source and drain thereof (from which the signal is outputted) is grounded via a resistance element 102. The signal outputted via the P-channel MOS transistor 101 is outputted through two inverters 103 and 104 as an output signal $V_{out}$ (where $|V_{out}|$ also expresses the potential value thereof).

In the prior art input circuit as shown in FIG. 1, when the potential of the input signal $V_{in}$ is higher than a value of $(V_{DD}+|V_{tp}|)$ which is an addition of the reference voltage $V_{DD}$ and an absolute value $|V_{tp}|$ of the threshold voltage of the P-channel MOS transistor 101 (during the periods from $t_5$ to $t_7$ and from $t_{15}$ and $t_{17}$ as shown in FIG. 4A), the P-channel MOS transistor 101 is turned on and thereby the input level to the inverter 103 becomes an "H" level (during the periods from $t_6$ and $t_8$ and from $t_{16}$ to $t_{18}$ as shown in FIG. FIG. 4D). As a result, the output signal $V_{out}$ changes to the "H" level. In contrast with this, when the potential of the input signal $V_{in}$ is lower than the addition $(V_{DD}+|V_{tp}|)$, the P-channel MOS transistor 101 is turned off and thereby the input level of the inverter 103 becomes an "L" level. As a result, the output signal $V_{out}$ changes to the "L" level.

As the input signal $V_{in}$, an external signal used as an address signal or a control signal is often used, and the input signal $V_{in}$ is set so as to lie within a range between a ground potential $V_{SS}$ and the reference voltage $V_{DD}$ in the ordinary operation.

Further, as already explained, the potential of the input signal $V_{in}$ is compared with the voltage $(V_{DD}+|V_{tp}|)$ by the P-channel MOS transistor 101, and the potential of the output signal $V_{out}$ is determined as being the "H" or "L" level when the input signal $V_{in}$ is higher or lower than the voltage $(V_{DD}+|V_{tp}|)$, respectively.

By utilization of the above-mentioned potential change of the input signal $V_{in}$, it is possible to change the semiconductor integrated circuit device (e.g., memory device) from the ordinary operation status to another status (e.g., an operation test status) or vice versa.

In the above-mentioned prior art input potential detecting circuit as described above, however, there exists the following problem.

During the ordinary operation of the semiconductor memory device, the potential of the external input signal, that is, the input signal $V_{in}$ of the input circuit shown in FIG. 1 lies within a range between the ground potential $V_{SS}$ and the supply potential $V_{DD}$, as already explained. In this case, when the potential of the input signal $V_{in}$ is roughly the same as that of the supply potential $V_{DD}$, and further when the supply potential $V_{DD}$ is lowered due to fluctuations (e.g., noise) and thereby the difference in potential between the input signal $V_{in}$ and the supply potential $V_{DD}$ exceeds the absolute value $|V_{tp}|$ of the threshold value of the P-channel MOS transistor 101 (i.e., $V_{in}-V_{DD} \geq |V_{tp}|$) (periods from $t_1$ to $t_3$ and from $t_{11}$ to $t_{13}$), the P-channel MOS transistor 101 is turned on erroneously, so that the "H" level potential signal is outputted erroneously as the output signal $V_{out}$ (during the periods from $t_2$ to $t_4$ and from $t_{12}$ to $t_{14}$ as shown in FIG. 4C). In other words, the semiconductor memory device is changed from the ordinary operation status to another status (e.g., the operation test status) erroneously.

To overcome this problem, it may be possible to consider a method of increasing the absolute value $|V_{tp}|$ of the threshold voltage of the P-channel MOS transistor 101. In this method, however, when the reference potential $V_{DD}$ is set to a usual potential level or a level higher than the usual potential level, the potential of the input signal $V_{in}$ for changing the ordinary status of the memory device to another status (e.g., the test status) must be set to a very high potential value, thus resulting in another problem in that the characteristics of the transistor deteriorate due to the voltage stress.

In addition, a method of reducing resistance of the resistance element 102 connected to the P-channel MOS transistor 101 may be considered to prevent the above-mentioned erroneous operation. In this case, however, since the transistor current increases in the other status (e.g., the test status), there arises another problem in that the current consumption increases.

SUMMARY OF THE INVENTION

Accordingly, it is the object of the present invention to provide an input circuit and a semiconductor integrated circuit device including the input circuit, which are so constructed as not to be operated erroneously even if the supply or reference potential $V_{DD}$ fluctuates due to noise, for instance.

According to a first aspect of the present invention, an input circuit includes a signal input terminal, a first input potential detecting circuit, a second input potential detecting circuit, a delay circuit, a latch circuit and a signal output terminal. The signal input terminal applies an external input signal.

First input potential detecting circuit compares a potential of the input signal with a predetermined reference potential to detect a potential difference between the two.

The second input potential detecting circuit is activated in response to a control signal, and compares the potential of the input signal with the predetermined reference potential to detect the potential difference between the two.

The delay circuit delays an output of the first input potential detecting circuit by a predetermined delay time.

The latch circuit inputs an output signal of the delay circuit as data and an output signal of the second input potential detecting circuit as a clock, to generate an output signal according to potentials of these two inputted signals.

The signal output terminal for outputting the output signal of the latch circuit.

An output of the first input potential detecting circuit is inputted to latch the circuit via the delay circuit. The second input potential detecting circuit is controlled by a control signal, and an output of the second potential input detecting circuit is inputted to the latch circuit. Therefore, even if the supply (reference) potential $V_{DD}$ fluctuates due to noise, for instance, and the input circuit operates erroneously as a result of the comparison between the input signal and the reference signal, as far as the control signal inputted to the second input potential detecting circuit is not changed from a specific potential, the output potential of the input circuit can be kept at the status prior to the erroneous operation. Further, the output potential of the input circuit can be changed, by changing the input signal on condition that the control signal is changed from the specific potential.

Further, according to a second aspect of the present invention, an input circuit includes a signal input terminal, a first input potential detecting circuit, a second input potential detecting circuit, a delay latch circuit and a signal output terminal.

The signal input terminal applies an external input signal.

The first input potential detecting circuit for comparing a potential of the input signal with a predetermined reference potential to detect a potential difference between the two;

a second input potential detecting circuit activated in response to a control signal, and compares the potential of the input signal with the predetermined reference potential to detect the potential difference between the two.

The delay latch circuit delays an output of the first input potential detecting circuit by a predetermined delay time to obtain a first signal, and obtain an output of the second input potential detecting circuit as a second signal, and generating an output signal thereof in cooperation with the first signal and the second signal.

The signal output terminal outputs the output signal of the delay latch circuit.

The outputs of the first and second input potential detecting circuits are inputted to the delay latch circuit so constructed as to have both the functions of the delay circuit and the latch circuit in combination. Only the output of the first input potential detecting circuit is delayed by a predetermined time, and the second input potential detecting circuit is controlled by the control signal. Therefore, in the same way, even if the supply or reference potential $V_{DD}$ fluctuates due to noise, for instance, and the input circuit operates erroneously as a result of the comparison between the input signal and the reference signal, as far as the control signal inputted to the second input potential detecting circuit is not changed from a specific potential, the output potential of the input circuit can be kept at the status prior to the erroneous operation. Further, the output potential of the input circuit can be changed, by changing the input signal on condition that the control signal is changed from the specific potential.

Further, when the control signal is generated on the basis of the chip-enable signal, the construction of the input circuit can be facilitated. Further, when the control signal is inputted from the outside independently, it is possible to stabilize the input circuit operation more securely.

According to a third aspect of the present invention, an input circuit includes a signal input terminal, a first input potential detecting circuit, a plurality of second input potential detecting circuits, a logic circuit, a delay circuit, a latch circuit and a signal output terminal.

The signal input terminal applies an external input signal.

A first input potential detecting circuit compares a potential of the input signal with a predetermined reference potential to detect a potential difference between the two.

Each of the plurality of second input potential detecting circuits is activated in response to a different control signal respectively, and compares the potential of the input signal with the predetermined reference potential to detect the potential difference between the two, respectively.

The logic circuit generates an effective output when at least one of outputs of a plurality of the second input potential detecting circuits is effective.

The delay circuit delays an output of the first input potential detecting circuit by a predetermined delay time.

The latch circuit inputs an output signal of the delay circuit as data and an effective output signal of said logic circuit as a clock, to generate an output signal according to potentials of these two inputted signals.

The signal output terminal for outputting the output signal of the latch circuit.

BRIEF DESCRIPTION OF THE DRAWINGS

FIG. 2 is a circuit diagram showing a first embodiment of the input circuit according to the present invention, which is formed on a part of a semiconductor integrated circuit device;

DETAILED DESCRIPTION OF PREFERRED EMBODIMENTS

Figure 1:
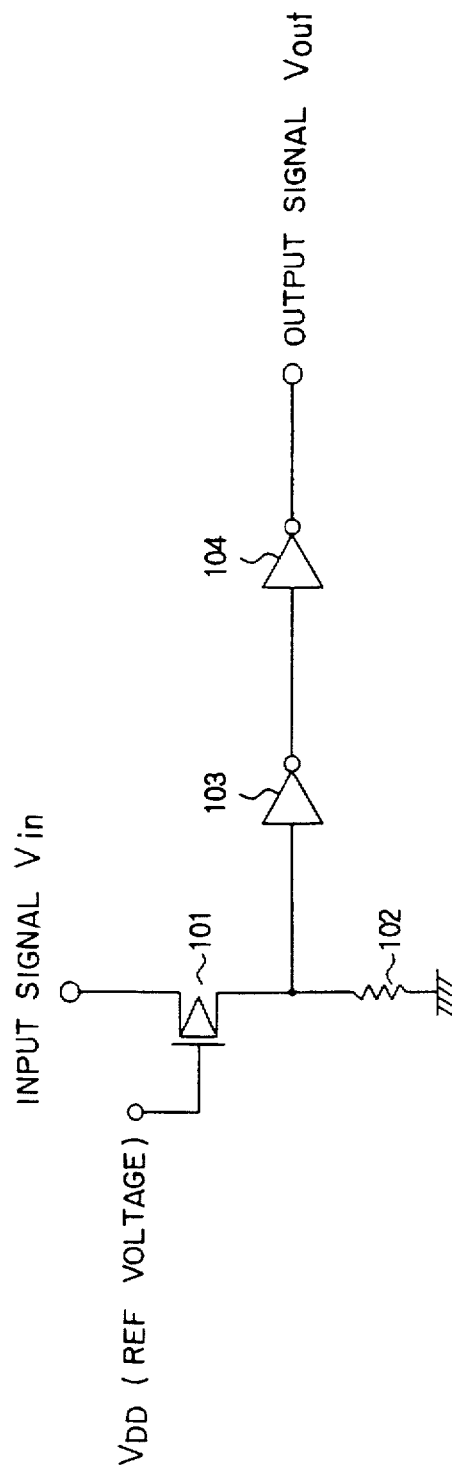
FIG. 1 is a circuit diagram showing an example of prior art input potential detecting circuits.

Embodiments of the input circuit according to the present invention will be described hereinbelow with reference to the attached drawings. The input circuit is formed on a part of a substrate of a semiconductor integrated circuit device.

FIG. 2 is a circuit diagram showing a first embodiment thereof. In FIG. 2, the input circuit is composed of a main input potential detecting circuit 1, a subsidiary input potential detecting circuit 2, a delay circuit 3, and a latch circuit 4.

The main input potential detecting circuit 1 includes a P-channel MOS transistor 11, a resistance element 12, and an inverter 13. The P-channel MOS transistor 11, whose gate terminal is supplied with a supply voltage $V_{DD}$ as a reference voltage, and the resistance element 12 are connected between a signal input terminal and to and the inverter 13 are connected between the signal input terminal and an output node a1 of the main input potential detecting circuit. The input signal $V_{in}$ is applied to the signal input terminal, and the supply voltage $V_{DD}$ is applied to a gate of the P-channel MOS transistor 11 as a reference potential. Further, the resistance element 12 is connected between an input node of the inverter 13 and the ground potential.

The output node a1 of the main input potential detecting circuit 1 is connected to an input node of the delay circuit 3 composed of four series-connected inverters 31, 32, 33 and 34. An output node of the delay circuit 3 is connected to a latch circuit 4 composed of two loop like connected NOR circuits 41 and 42. The two NOR circuits 41 and 42 for constructing the latch circuit 4 have two inputs respectively, and are connected in such a way that an output of one NOR circuit is connected to one input of the other NOR circuit mutually. In more detail, an output node c2 of the NOR circuit 42 is connected to one input of the NOR circuit 41, and an output node of the NOR circuit 41 is connected to one input of the NOR circuit 42. Further, an output node of the delay circuit 3 is connected to the other input (data input terminal) of the NOR circuit 41, and an output node b1 of the subsidiary input potential detecting circuit 2 is connected to the other input (clock input terminal) of the NOR circuit 42.

The subsidiary input potential detecting circuit 2 includes a P-channel MOS transistor 21, and N-channel MOS transistor 22, a resistance element 23, and an inverter 24. The P-channel MOS transistor 21, the N-channel MOS transistor 22, and the inverter 24 are connected between the signal input terminal and an output node b1 of the subsidiary input potential detecting circuit 2. The input signal $V_{in}$ is applied to the signal input terminal; the supply voltage $V_{DD}$ is applied to a gate of the P-channel MOS transistor 21 as a reference potential; and a control signal C is inputted to a gate of the N-channel MOS transistor 22. Further, the resistance element 23 is connected between an input node of the inverter 24 and the ground potential.

As the control signal C applied to the gate of the N-channel MOS transistor 22, a chip enable signal is usually used. Without being limited only thereto, any signal can be used, as far as the control signal C can change the output signal level of the input circuit in cooperation with the input signal $V_{in}$, in such a way that the ordinary operation status of the integrated circuit device can be changed over to another mode (e.g., a test operation status thereof) or vice versa. For example, the control signal can be supplied from outside of the integrated circuit on which the input circuit is formed.

Further, the output node b1 of the subsidiary input potential detecting circuit 2 is connected to one input of the NOR circuit 42, as already explained. Further, the output $V_{out}$ of the input circuit shown in FIG. 2 is the same as the output node of the NOR circuit 41 of the latch circuit 4.

The operation of the input circuit shown in FIG. 2 will be described hereinbelow with reference to FIGS. 4A to 4C and 4E.

Figure 4:
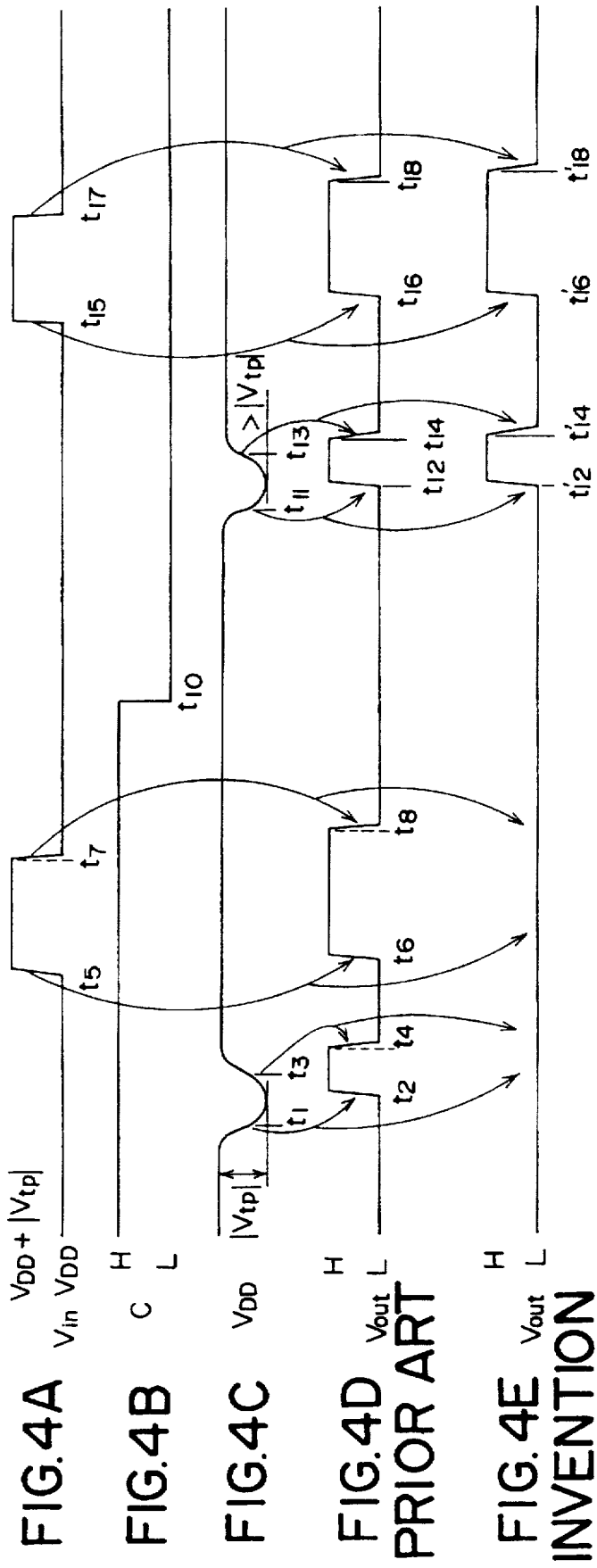
FIGS. 4A to 4E are waveform diagrams showing the potential changes of the various signals $V_{DD}$ and $V_{out}$ caused by changes in potential of the input signal $V_{in}$ and the control signal C.

At time $t_{10}$ in FIG. 4B, when the control signal C applied to the gate of the N-channel MOS transistor 22 changes to the "L" level, since the N-channel MOS transistor 22 is turned off, the potential at the output node b1 of the subsidiary input potential detecting circuit 2 is at the "H" level, irrespective of the potential of the input signal $V_{in}$, so that the internal node c2 of the latch circuit 4 is at the "L" level. Accordingly, the potential of the output signal of the input circuit shown in FIG. 2 can be determined on the basis of the operation of the main input potential detecting circuit 1.

In more detail, when the potential of the input signal $V_{in}$ is higher than the potential ($V_{DD}$+|$V_{tp}$|) (where $V_{tp}$ denotes the threshold voltage of the two P-channel transistors 11 and 21) (during the period from $t_{15}$ to $t_{17}$ shown in FIG. 4A), since the P-channel MOS transistor 11 is turned on and thereby the input of the inverter 13 changes to the "H" level, the potential at the output node a1 of the main input potential detecting circuit 1 is at the "L" level, so that the potential of the output signal $V_{out}$ of the input circuit shown in FIG. 2 is at the "H" level (during the period from $t_{16}'$ to $t_{18}'$ in FIG. 4E).

On the other hand, when the potential of the input signal $V_{in}$ becomes lower than the potential ($V_{DD}$+|$V_{tp}$|), since the P-channel MOS transistor 11 is turned off and thereby the input of the inverter 13 changes to the "L" level, the potential at the output node a1 of the main input potential detecting circuit 1 is at the "H" level, so that the potential of the output signal $V_{out}$ of the input circuit shown in FIG. 2 is at the "L" level.

Further, when the supply or reference potential $V_{DD}$ is lowered due to noise, for instance on condition that the input potential $V_{in}$ is at roughly the same level as the supply or reference potential $V_{DD}$, since the potential difference between the input signal $V_{in}$ and the supply potential $V_{DD}$ becomes higher than the absolute value |$V_{tp}$| of the threshold voltage of the P-channel MOS transistor 11 ($V_{in}$−$V_{DD}$≧|$V_{tp}$|) (during the period between $t_{11}$ and $t_{13}$ as shown in FIG. 4C), the P-channel MOS transistor 11 is turned on erroneously, with the result that the "H" level output signal develops (during the period from $t_{12}'$ to $t_{14}'$ shown in FIG. 4E) as the output signal $V_{out}$ of the input circuit shown in FIG. 2.

Further, when the control signal "C" is at the "H" level (prior to time $t_{10}$ shown in FIG. 4C), the N-channel MOS transistor 22 is turned on. Under these conditions, when the potential of the input signal $V_{in}$ becomes lower than ($V_{DD}$+|$V_{tp}$|), since the two MOS transistors 11 and 12 are both turned off, both the inputs to the two inverters 13 and 24 are both at the "L" level, so that the two output nodes a1 and b1 of the main and subsidiary input potential detecting circuits 1 and 2 are both at the "H" level. As a result, the internal node c2 of the latch circuit 4 is at the "L" level, so that the potential of the output signal $V_{out}$ of the input circuit shown in FIG. 2 changes to the "L" level.

Further, when the potential of the input signal $V_{in}$ changes from a level lower than ($V_{DD}$+|$V_{tp}$|) to a high level at time $t_8$ in FIG. 4A, since the two MOS transistors 11 and 12 are both turned on, both the inputs of the two inverters 13 and 24 are both at the "H" level, so that the two output nodes a1 and b1 of the main and subsidiary input potential detecting circuits 1 and 2 are both at the "L" level.

Here, since being supplied to the latch circuit 4 via the delay circuit 3, the output signal (the potential at the node a1) of the main input potential detecting circuit 1 is inputted to the latch circuit 4, after the output signal (the potential at the node b1) of the subsidiary input potential detecting circuit 2 has been supplied to the latch circuit 4.

Consequently, at the time point when the "L" level output signal of the subsidiary input potential detecting circuit 2 is inputted to the latch circuit 4, since the output signal $V_{out}$ of the input circuit shown in FIG. 2 is still kept at the "L" level (the same as the output potential obtained where the potential of the input signal $V_{in}$ is lower than ($V_{DD}$+|$V_{tp}$|), the internal node c2 of the latch circuit 4 is at the "H" level. As a result, the output signal $V_{out}$ of the input circuit shown in FIG. 2 is kept at the "L" level, irrespective of the output signal level of the main input potential detecting circuit 1.

Further, in the circuit construction of the first embodiment shown in FIG. 2, on condition that the control signal C is at the "H" level and further the potential of the input signal $V_{in}$ is fixed at the potential lower than the $(V_{DD}+|V_{tp}|)$, in case the supply potential $V_{DD}$ is lowered due to the noise fluctuations, for instance and thereby the potential difference between the input signal $V_{in}$ and the supply potential $V_{DD}$ exceeds the threshold voltage $|V_{tp}|$ of the P-channel MOS transistors 11 and 12 $(V_{in}-V_{DD} \geq |V_{tp}|)$, the P-channel MOS transistors 11 and 12 are both turned on erroneously. In this case, however, the potential of the output signal $V_{out}$ of the input circuit can be kept at the "L" level.

As described above, in the first embodiment, it is possible to prevent the erroneous operation of the input circuit, even if any one of the input signal $V_{in}$ and the supply or reference potential $V_{DD}$ fluctuates.

In other words, in the case where the semiconductor integrated circuit device (e.g., a memory device) is set to the ordinary operation status when the potential of the output signal $V_{out}$ thereof is at the "L" level but set to another status (e.g., an operation test status) when at the "H" level, even if the supply or reference potential $V_{DD}$ fluctuates due to noise, for instance, it is possible to prevent the semiconductor integrated circuit device from being shifted erroneously from the ordinary operation status to another status (e.g., the operation test status).

Figure 3:
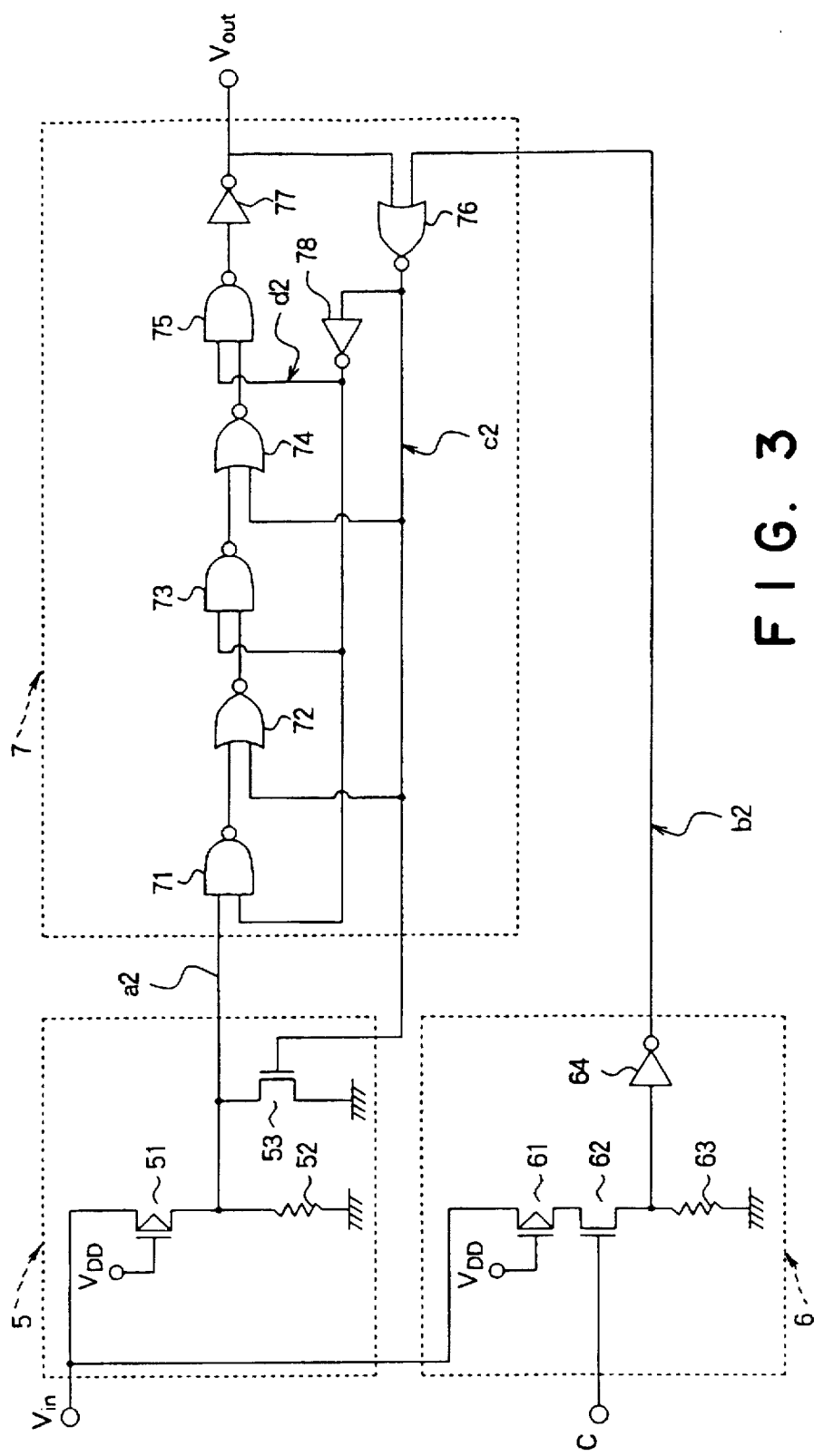
FIG. 3 is a circuit diagram showing a second embodiment of the input circuit according to the present invention, which is formed on a part of a semiconductor integrated circuit device.

FIG. 3 is a circuit diagram showing a second embodiment of the input circuit according to the present invention formed on a substrate of the semiconductor integrated circuit device. The input circuit shown in FIG. 3 is composed of a main input potential detecting circuit 5, a subsidiary input potential detecting circuit 6, and a delay latch circuit 7.

The main input potential detecting circuit 5 includes a P-channel MOS transistor 51, a resistance element 52, and an N-channel MOS transistor 53. The P-channel MOS transistor 51 is connected between a signal input terminal and an output node a2 of the main input potential detecting circuit 5. The input signal $V_{in}$ is applied to a signal input terminal; a supply voltage $V_{DD}$ is applied to a gate of the P-channel MOS transistor 51 as a reference potential. Further, the resistance element 52 is connected between an output node a2 of the main input potential detecting circuit 5 and a ground potential. Further, the N-channel MOS transistor 53 is connected between the output node a2 of the main input potential detecting circuit 5 and the ground potential, in order to discharge the potential at the output node a2. A signal described later is supplied to a gate of this N-channel MOS transistor 53.

The subsidiary input potential detecting circuit 6 includes a P-channel MOS transistor 61, an N-channel MOS transistor 62, a resistance element 63, and an inverter 64. The input signal $V_{in}$ is applied to the signal input terminal; the supply voltage $V_{DD}$ is applied to a gate of the P-channel MOS transistor 61 as a reference potential; and a control signal C is applied to a gate of the N-channel MOS transistor 62. Further, the resistance element 63 is connected between an input node of the inverter 64 and the ground potential. The output node b2 of the subsidiary input potential detecting circuit 6 is connected to one of two inputs of a NOR circuit 76, as described later.

The delay latch circuit 7 includes three NAND circuits 71, 73 and 75, three NOR circuits 72, 74 and 76, and two inverters 77 and 78 in combination. These three NAND circuits 71, 73 and 75 and NOR circuits 72, 74 and 76 are all of the two-input type.

The output node a2 of the main input potential detecting circuit 5 is connected to one input of the NAND circuit 71; the output of the NAND circuit 71 is connected to one input of the NAND circuit 71 is connected to one input of the NOR circuit 72; the output of the NOR circuit 72 is connected to one input of the NAND circuit 73; the output of the NAND circuit 73 is connected to one input of the NOR circuit 74; the output of the NOR circuit 74 is connected to one input of the NAND circuit 75; and the output of the NAND circuit 75 is connected to an input of the inverter 77. These three NAND circuits 71, 73 and 75, two NOR circuits 72 and 74, and the inverter 77 construct a delay circuit section.

The output node b2 of the subsidiary input potential detecting circuit 6 is connected to one input of the NOR circuit 76; an output of the inverter 77 is connected to the other input of the NOR circuit 76; and an output of the NOR circuit 76 is connected to a gate of the N-channel MOS transistor 53 and the other inputs of the two NOR circuits 72 and 74. Further, the output of the NOR circuit 76 is connected to the other inputs of the three NAND circuits 71, 73 and 75 via an inverter 78. According, the NAND circuit 75, the inverter 77, the NOR circuit 76, and the inverter 78 are all connected circularly in a loop manner so as to construct a latch circuit section. Further, the output $V_{out}$ of the input circuit shown in FIG. 3 is the output of the inverter 77 of the delay latch circuit 7.

The second embodiment shown in FIG. 3 is basically the same in construction as that of the first embodiment shown in FIG. 2. In this second embodiment, however, the main input potential detecting circuit 5 is additionally provided with the N-channel MOS transistor 53 to discharge the potential at the output node a2; the two outputs of the main and subsidiary input potential detecting circuits 5 and 6 are both supplied to the delay latch circuit 7; and the output of the delay latch circuit 7 is the output signal $V_{out}$ of the input circuit shown in FIG. 3. In addition, the potential of the output signal $V_{out}$ decided on the basis of the potentials of the input signal $V_{in}$ and the control signal C is quite the same as with the case of the first embodiment shown in FIG. 2.

The operation of the input circuit shown in FIG. 3 will be described hereinbelow.

When the control signal C inputted to the gate of the N-channel MOS transistor 62 is at the "L" level (after time $t_{10}$ shown in FIG. 4B), since the N-channel MOS transistor 62 is turned off, the potential at the output node b2 of the subsidiary input potential detecting circuit 6 is at the "H" level, irrespective of the potential of the input signal $V_{in}$, so that the potential at the node c2 is at the "L" level and the potential at the node d2 is at the "H" level. Accordingly, the potential of the output signal $V_{out}$ of the input circuit shown in FIG. 3 can be decided on the basis of the potential at the output node a2 of the main input potential detecting circuit 5.

In more detail, when the potential of the input signal $V_{in}$ is lower than the potential $(V_{DD}+|V_{tp}|)$, the potential at the output node a2 is at the "L" level, so that the potential of the output signal $V_{out}$ of the input circuit is at the "L" level. Further, when the potential of the input signal $V_{in}$ is higher than the potential $(V_{DD}+|V_{tp}|)$ (during the period from $t_{15}$ to $t_{17}$ shown in FIG. 4A), the potential at the output node a2 of the main input potential detecting circuit 5 is at the "H" level, so that the potential of the output signal $V_{out}$ of the input circuit shown in FIG. 3 is at the "H" level (during the period from $t_{16}'$ to $t_{18}'$ shown in FIG. 4E).

Further, when the supply potential $V_{DD}$ is lowered in such a way as to satisfy the relationship $(V_{in}-V_{DD} \geq |V_{tp}|)$ (during the period from $t_{11}$ to $t_{13}$ shown in FIG. 4C), since the P-channel MOS transistor 51 operates erroneously, the "H"

level signal develops at the output $V_{out}$ (during the period from $t_{12}'$ to $t_{14}'$ shown in FIG. 4E).

Here, however, when the potential of the control signal C is at the "H" level, the N-channel MOS transistor 62 is turned on. In this case, if the input signal $V_{in}$ is lower than $(V_{DD}+|V_{tp}|)$, since the potential at the output node b2 of the subsidiary input potential detecting circuit 6 is at the "H" level, the potential at the node c2 is at the "L" level and the potential at the output node d2 is at the "H" level. Here, since the potential at the output node a2 of the main input potential detecting circuit 5 is at the "L" level, the potential of the output signal $V_{out}$ is at the "L" level.

Further, when the potential of the input signal $V_{in}$ changes from a potential lower than $(V_{DD}+|V_{tp}|)$ (at this time, the output signal $V_{out}$ is at the "L" level ) to a high potential level, the output node b2 of the subsidiary input potential detecting circuit 6 is at the "L"level, and the output node a2 of the main input potential detecting circuit 5 is at the "H" level. Therefore, although the potential of the output signal $V_{out}$ is changed to the "H" level, since this level-change time is later than the time when the potential at the node b2 changes to the "L" level, the potential of the output signal $V_{out}$ is still kept at the "L" level at the time when the potential at the node b2 changes to the "L" level.

Therefore, at this time, since the potential at the node c2 changes to the "H" level and thereby the N-channel MOS transistor 53 is turned on, so that the potential at the node a2 is discharged through the transistor 53 from the "H" level to the "L" level. Further, since the node c2 changes to the "H" level, the potential at the node d2 changes to the "L" level. As a result, the output signal $V_{out}$ of the input circuit shown in FIG. 3 is held at the "L" potential level, irrespective of the detection status of the main input potential detecting circuit 5.

In other words, even if the supply potential $V_{DD}$ is lowered due to fluctuations by noise and thereby the potential difference between the input signal $V_{in}$ and the supply potential $V_{DD}$ becomes higher than the threshold voltage $|V_{tp}|(V_{in}-V_{DD} \geq |V_{tp}|)$; that is, even when the P-channel MOS transistors 51 and 61 are both turned on erroneously, it is possible to keep the potential of the output signal $V_{out}$ at the "L" level as it is.

As described above, when the control signal C is at the "L" level, in case the input signal $V_{in}$ or the supply or reference potential $V_{DD}$ fluctuates, the erroneous operation signal develops as the output signal $V_{out}$. However, when the control signal C is at the "H" level, in case the input signal $V_{in}$ or the supply ore reference potential $V_{DD}$ fluctuates, the erroneous operation signal will not develop at the signal output terminal as the output signal $V_{out}$, so that it is possible to prevent the succeeding state circuits responsive to the output signal $V_{out}$ from being operated erroneously.

Figure 5:
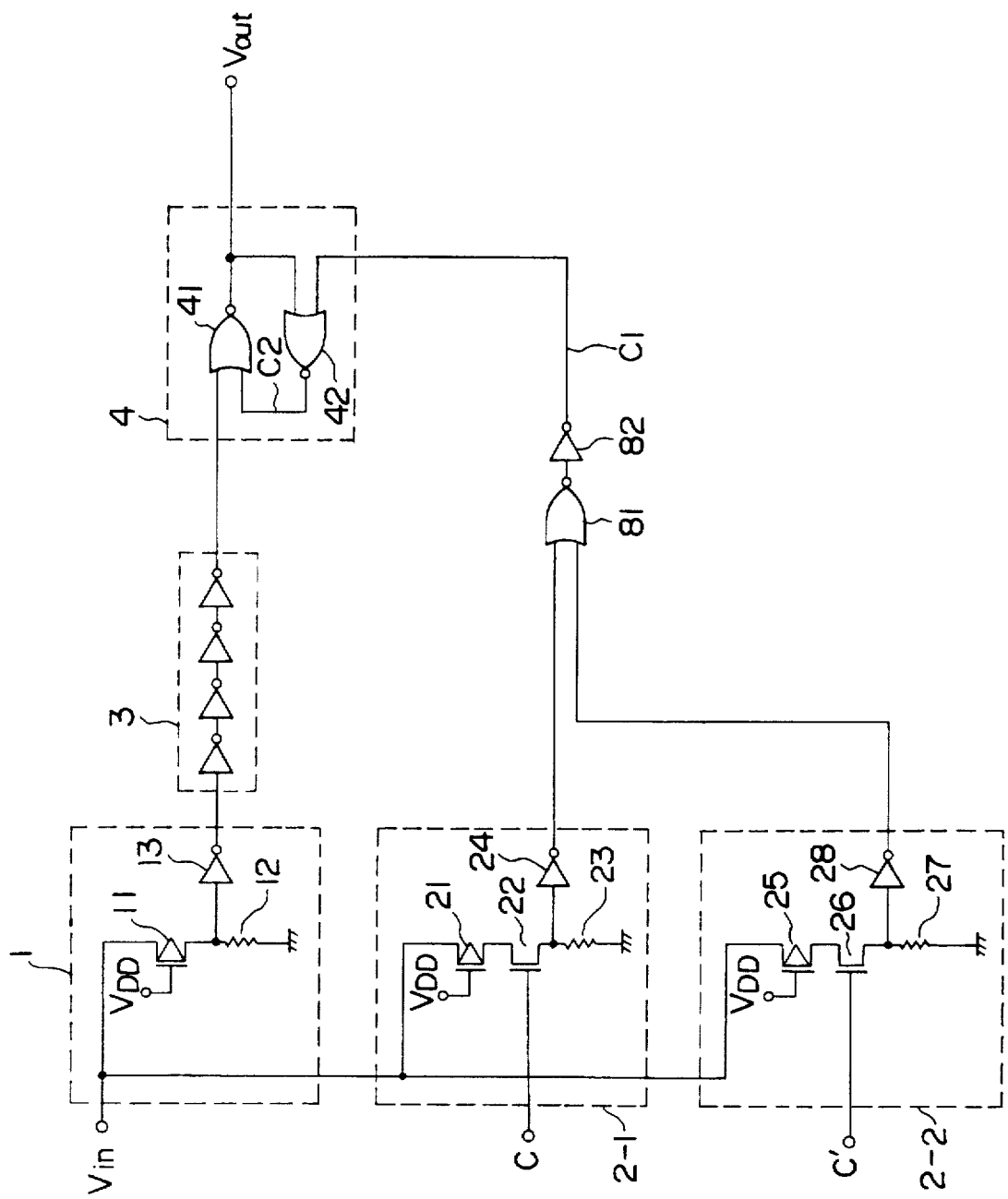
FIG. 5 is a circuit diagram showing a third embodiment of the input circuit according to the present invention, which is formed on a part of a semiconductor integrated circuit device.

FIG. 5 is a circuit diagram showing a third embodiment of the input circuit according to the present invention. In this third embodiment, two subsidiary input potential detecting circuits each the same as in the case of the first embodiment shown in FIG. 2 are provided. In FIG. 5, the same reference numerals have been retained for the similar circuit elements which have the same functions as in the case of the first embodiment, without repeating the similar description.

In FIG. 5, the subsidiary input potential detecting circuit 2-1 is quite the same as the subsidiary input potential detecting circuit 2 shown in FIG. 2, and further the subsidiary input potential detecting circuit 2-2 is composed of similar circuit elements 25 to 28 corresponding to the circuit elements 21 to 24 of the subsidiary input potential detecting circuit 2-1. Although the circuit construction is quite the same in both, the control signal C' applied to the gate of the N-channel MOS transistor 26 is different form the control signal C applied to the gate of the N-channel MOS transistor 22.

The output of the subsidiary circuit 2-1 and the output of the subsidiary circuit 2-2 are both supplied to a NOR circuit 81. The output of this NOR circuit 81 is inverted by an inverter 82, and further the inverted output at a node C1 is given to one input of the NOR circuit 42 of the latch circuit 4.

In the first embodiment shown in FIG. 2, when the control signal is at the "H" level, even if the input signal $V_{in}$ becomes higher than $(V_{DD}+|V_{tp}|)$, the potential at the output terminal $V_{out}$ is kept at the "L" level. In this third embodiment shown in FIG. 5, as far as any one of the two control signal C and C' is at the "L" level, since the node C1 changes to the "H" level irrespective of the potential of the input signal $V_{in}$ through the NOR circuit 81 and the inverter 82, the potential value of the output terminal $V_{out}$ can be decided on the basis of the output signal of the main input potential detecting circuit 1. In other words, when the potential of the input signal $V_{in}$ becomes higher than $(V_{DD}+|V_{tp}|)$, the output signal $V_{out}$ changes from the "L" level to the "H" level.

Consequently, it is possible to switch the mode (output levels) of the input circuit according to the potential of the input signal $V_{in}$ by controlling the control signal C', irrespective of the control signal C.

It is preferable that the input circuits described above are formed on a substrate with circuits which are supplied signals outputted therefrom to constitute semiconductor integrated circuits.

What is claimed is:

1. An input circuit, comprising:
    a signal input terminal for applying an external input signal;
    a first input potential detecting circuit for comparing a potential of the input signal with a predetermined reference potential to detect a potential difference between the two;
    a second input potential detecting circuit activated in response to a control signal, for comparing the potential of the input signal with the predetermined reference potential to detect the potential difference between the two;
    a delay circuit for delaying an output of said first input potential detecting circuit by a predetermined delay time;
    a latch circuit for inputting an output signal of said delay circuit as data and an output signal of said second input potential detecting circuit as a clock, to generate an output signal according to potentials of these two inputted signals; and
    a signal output terminal for outputting the output signal of said latch circuit.

2. The input circuit according to claim 1, wherein:
    said first input potential detecting circuit comprises:
        a first first-conductivity type transistor, the predetermined reference potential being inputted to a gate thereof, the input signal being applied to one of a source and a drain thereof, and the other of the source and the drain thereof being connected to a supply potential via a first resistance element and used as an output end thereof; and
    said second input potential detecting circuit comprises:

a second first-conductivity type transistor, the predetermined reference potential being inputted to a gate thereof, and the input signal being applied to one of a source and a drain thereof; and a second-conductivity type transistor, the control signal being inputted to a gate thereof, one of a source and a drain thereof being connected to the other of the source and the drain of said second first-conductivity type transistor, and the other of the source and the drain thereof being connected to the supply potential via a second resistance element and used as an output end thereof.

3. The input circuit according to claim 1, wherein said delay circuit is composed of an even number of inverters connected in series.

4. The input circuit according to claim 1, wherein the control signal is a chip enable signal or a signal derived from the chip enable signal.

5. The input circuit according to claim 1, wherein the control signal is a signal supplied from the outside independently.

6. A semiconductor integrated circuit including the input circuit according to claim 1, wherein said semiconductor integrated circuit further includes other circuits to which a signal outputted from the input circuit is supplied.

7. An input circuit, comprising:

a signal input terminal for applying an external input signal;

a first input potential detecting circuit for comparing a potential of the input signal with a predetermined reference potential to detect a potential difference between the two;

a second input potential detecting circuit activated in response to a control signal, for comparing the potential of the input signal with the predetermined reference potential to detect the potential difference between the two;

a delay latch circuit for delaying an output of said first input potential detecting circuit by a predetermined delay time to obtain a first signal, obtaining an output of said second input potential detecting circuit as a second signal, and generating an output signal thereof in cooperation with the first signal and the second signal; and a signal output terminal for outputting the output signal of said delay latch circuit.

8. The input circuit according to claim 7, wherein:

said first input potential detecting circuit comprises:

a first first-conductivity type transistor, the predetermined reference potential being inputted to a gate thereof, the input signal being applied to one of a source and a drain thereof, and the other of the source and the drain thereof being connected to a supply potential via a first resistance element and used as an output end thereof; and said second input potential detecting circuit comprises:

a second first-conductivity type transistor, the predetermined reference potential being applied to a gate thereof, and the input signal being applied to one of a source and a drain thereof; and a second-conductivity type transistor, the control signal being inputted to a gate thereof, one of a source and a drain thereof being connected to the other of the source and the drain of said second first-conductivity type transistor, and the other of the source and the drain thereof being connected to the supply potential via a second resistance element and used as an output end thereof.

9. The input circuit according to claim 7, wherein said delay latch circuit comprises:

a gate assembly composed of a plurality of gate stages each having logical inversion function, an output of said first input potential detecting circuit being applied to a first stage thereof; and at least two gates circularly connected to a final stage of said gate assembly and each having a logical inversion function.

10. The input circuit according to claim 9, wherein each of said gates having the logical inversion function, respectively is selected from the group consisting of NOR circuit, NAND circuit, and inverter circuit.

11. The input circuit according to claim 9, which further comprises a transistor connected to an output node of said first input potential detecting circuit, a gate thereof being controlled by an output of said two circularly connected gates.

12. The input circuit according to claim 7, wherein the control signal is a chip enable signal or a signal derived from the chip enable signal.

13. The input circuit of claim 7, wherein the control signal is a signal inputted from the outside independently.

14. A semiconductor integrated circuit including the input circuit according to claim 7, wherein said semiconductor integrated circuit further includes other circuits to which a signal outputted from the input circuit is supplied.

15. An input circuit comprising:

a signal input terminal for applying an external input signal;

a first input potential detecting circuit for comparing a potential of the input signal with a predetermined reference potential to detect a potential difference between the two;

a plurality of second input potential detecting circuits, each of the second input potential detecting circuits being activated in response to a different control signal, for comparing the potential of the input signal with the predetermined reference potential to detect the potential difference between the two;

a logic circuit for generating an effective output when at least one of outputs of said second input potential detecting circuits is effective;

a delay circuit for delaying an output of said first input potential detecting circuit by a predetermined delay time;

a latch circuit for inputting an output signal of said delay circuit as data and the effective output signal of said logic circuit as a clock, to generate an output signal according to potentials of these two inputted signals; and a signal output terminal for outputting the output signal of said latch circuit.

16. A semiconductor integrated circuit including the input circuit according to claim 15, wherein said semiconductor integrated circuit further includes other circuits to which a signal outputted from the input circuit is supplied.

* * * * *